(12) United States Patent
Oda et al.

(10) Patent No.: US 6,238,777 B1
(45) Date of Patent: May 29, 2001

(54) PRINTED-CIRCUIT BOARD

(75) Inventors: Ryuji Oda, Kariya; Koji Kondo, Toyohashi, both of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/166,589

(22) Filed: Oct. 6, 1998

(30) Foreign Application Priority Data

Oct. 6, 1997 (JP) .................................................. 9-272931

(51) Int. Cl.$^7$ .................................................. B32B 3/00
(52) U.S. Cl. ........................ 428/209; 174/73.1; 174/255
(58) Field of Search .................................. 428/209, 255, 428/73.1

(56) References Cited

U.S. PATENT DOCUMENTS

| | | | |
|---|---|---|---|
| 3,142,610 | * | 7/1964 | Lowe .................................. 428/223 |
| 5,165,984 | * | 11/1992 | Schoenthaler ........................ 428/209 |
| 5,354,599 | * | 10/1994 | McClanahan et al. ............... 428/209 |
| 5,700,549 | * | 12/1997 | Garant et al. ........................ 428/209 |

FOREIGN PATENT DOCUMENTS

| | | |
|---|---|---|
| 559151341 | 11/1980 | (JP) . |
| 5-82929 | 4/1993 | (JP) . |
| 06085005 | 3/1994 | (JP) . |

\* cited by examiner

Primary Examiner—Cathy F. Lam
(74) Attorney, Agent, or Firm—Pillsbury Madison & Sutro LLP

(57) ABSTRACT

A printed-circuit board according to the present invention includes: a plurality of insulating layers; a plurality of conductive patterns formed in each insulating layer; and a plurality of closed and curved patterns each formed around the conductive patterns in each insulating layer, and each formed by a material having a coefficient of linear thermal expansion smaller than that of the insulating layer. In this case, each closed and curved pattern is made of copper and formed of same material as that of each conductive pattern. Further, when the coefficient of linear thermal expansion of each insulating layer is $\alpha 1$, when the coefficient of linear thermal expansion of each conductive layer is $\alpha 2$, and when the coefficient of linear thermal expansion of each closed and curved pattern is $\alpha 3$, the following condition, i.e., $\alpha 1 > \alpha 2 \geq \alpha 3$, is satisfied.

4 Claims, 4 Drawing Sheets

PRINTED-CIRCUIT BOARD

BACKGROUND OF THE INVENTION

1. Field of the Invention

The present invention relates to a printed-circuit board.

2. Description of the Related Art

A structure for dispersing stress generated in a printed-circuit board has been disclosed, for example, in the Japanese Unexamined Patent Publication No. 6-85005. According to this structure, a resin having a coefficient of linear thermal expansion smaller than that of the printed-circuit board is filled in a gap between the printed-circuit board and a semiconductor chip mounted on the board, and expansion and contraction of the printed-circuit board is suppressed in accordance with a difference between a linear thermal expansion of the filled resin and of the printed-circuit board so that a thermal stress generated in the printed-circuit board is dispersed.

There are some problems, however, in the above structure as explained briefly below. That is, according to this structure, an effect of stress dispersion in the printed-circuit board is influenced by a state of the resin filled to the gap and a dispersion of the composition of the filled resin. As a result, cracks occur in a boundary portion between a conductive pattern (e.g., an electrode pattern) and an insulated layer. The above problem will be explained in detail with reference to FIG. 4 below.

SUMMARY OF THE INVENTION

An object of the present invention is to provide a printed-circuit board which can suppress an occurrence of cracks in the boundary portion under the conductive pattern in the insulating layer when the heat is applied to the printed-circuit board.

In accordance with the present invention, there is provided a printed-circuit board including: a plurality of insulating layers; a plurality of conductive patterns formed in each insulating layer; and a plurality of substantially closed and curved patterns each formed around the conductive patterns in each insulating layer, and each formed by a material having a coefficient of linear thermal expansion smaller than that of the insulating layer.

According to the above structure, when the heat is applied to the printed-circuit board, the thermal stress occurs in the boundary portion under the conductive pattern in the insulating layer due to the difference between the coefficients of linear thermal expansion. In the present invention, however, the thermal stress is dispersed in an area surrounded by the closed and curved pattern, based on an effect of a hydrostatic pressure due to the closed and curved pattern, so that the thermal stress becomes weak in the boundary portion. As a result, it is possible to prevent cracks in the boundary portion.

In a preferred embodiment, each closed and curved pattern is formed of the same material as that of each of the conductive patterns.

In another preferred embodiment, each closed and curved pattern is made of copper.

In still another preferred embodiment, when the coefficient of linear thermal expansion of each insulating layer is α1, when the coefficient of linear thermal expansion of each conductive layer is α2, and when the coefficient of linear thermal expansion of each closed and curved pattern is α3, the following condition, i.e., α1>α2≧α3, is satisfied.

DESCRIPTION OF PREFERRED EMBODIMENTS

Before describing the preferred embodiments of the present invention, a conventional art and its problem will be explained in detail with reference to the attached drawing.

Figure 4:
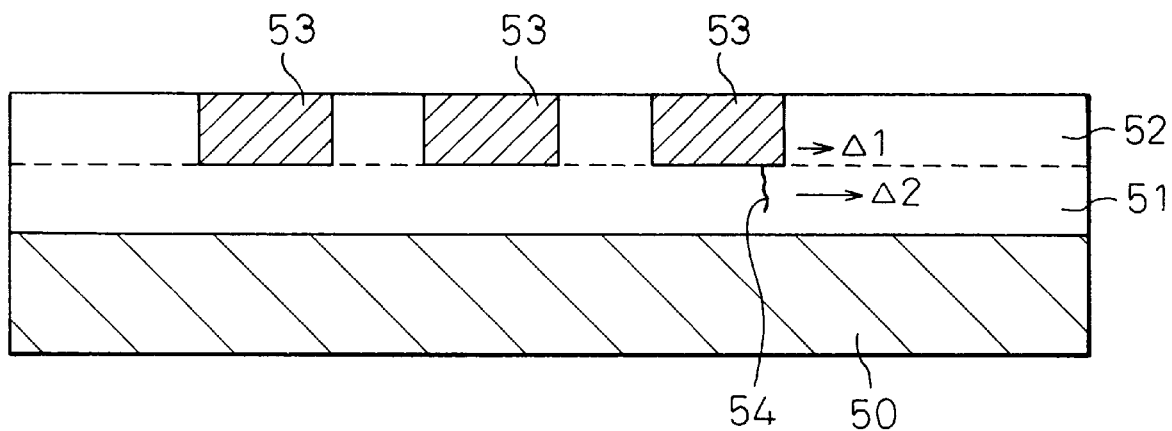
FIG. 4 is a partially sectional view of one example of a conventional printed-circuit board.

FIG. 4 is a partially sectional view of one example of the conventional printed-circuit board. In FIG. 4, reference number 50 denotes a core substrate formed by, for example, a multi-layer substrate, a double-faced substrate, or a simple board. Reference numbers 51 and 52 denote insulating layers formed on the core substrate 50. Reference numbers 53 denote conductive patterns formed in the insulating layer 52.

A printed-circuit board is usually manufactured as a composite material made of a glass fiber and an epoxy resin which are pressed after these are laid on one another. Further, recently, since many electronic parts have been miniaturized, it is required to provide fine wiring patterns and fine through-holes on the printed-circuit board in order to mount many small electronic parts. As a result, a build-up process has been developed in order to solve the above requirement.

According to the build-up process, the fine wiring patterns are formed by laying each insulating layer one by one as shown in FIG. 4.

In FIG. 4, the insulating layers 51 and 52 are formed on the core substrate 50, and the conductive patterns 53 are sequentially formed on the insulating layers 52. After the above processes, the multi-layer substrate is formed by laying down the above substrates in accordance with the build-up process.

In the substrate made by the build-up process, a laser or light development is used for forming very small holes, for example, about 100 μm in a diameter, in order to connect between the layers. Accordingly, it is very difficult to mix the glass fiber with the resin when preparing the very small holes. In this case, however, if the glass fiber is not mixed with the resin, the substrate including only the resin becomes very weak when the stress is applied thereto as explained above.

That is, there is a problem in which the substrate is broken when the thermal stress occurs if the glass fiber is not mixed with the resin. In FIG. 4, an arrow line Δ1 denotes an amount of expansion of the conductive pattern 53 when the heat was applied thereto. Further, an arrow line Δ2 denotes an amount of expansion of the insulating layers 51 and 52. Still further, reference number 54 is a crack which has occurred under the conductive pattern 53 in the insulating layer 51.

Accordingly, an object of the present invention is to provide a printed-circuit board which can suppress an occurrence of cracks in the boundary portion under the conductive pattern in the insulating layer when the heat is applied to the printed-circuit board.

The preferred embodiments of the present invention will be explained in detail with respect to the attached drawings.

Figure 1A:
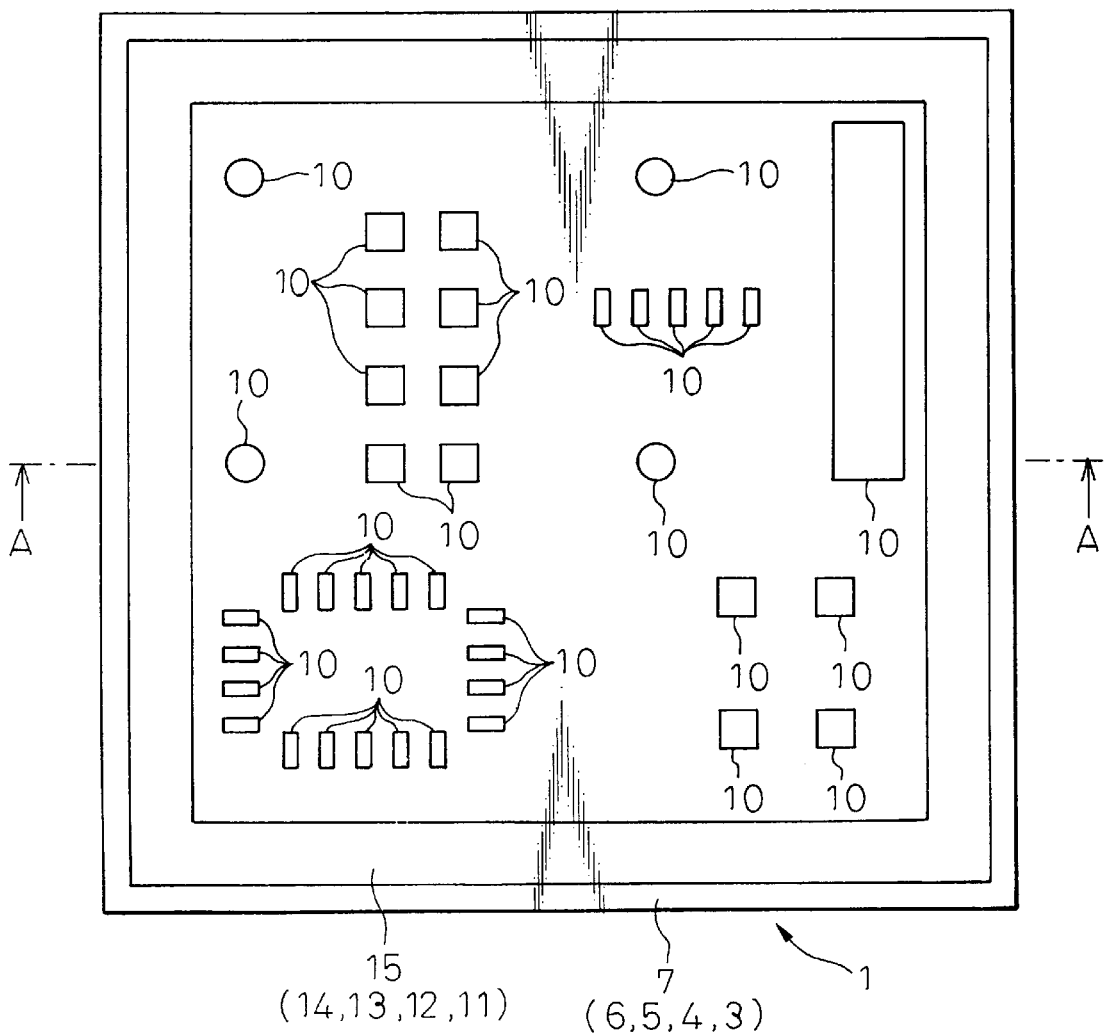
FIG. 1A is a plan view of a printed-circuit board according to the first embodiment of the present invention.
Figure 1B:
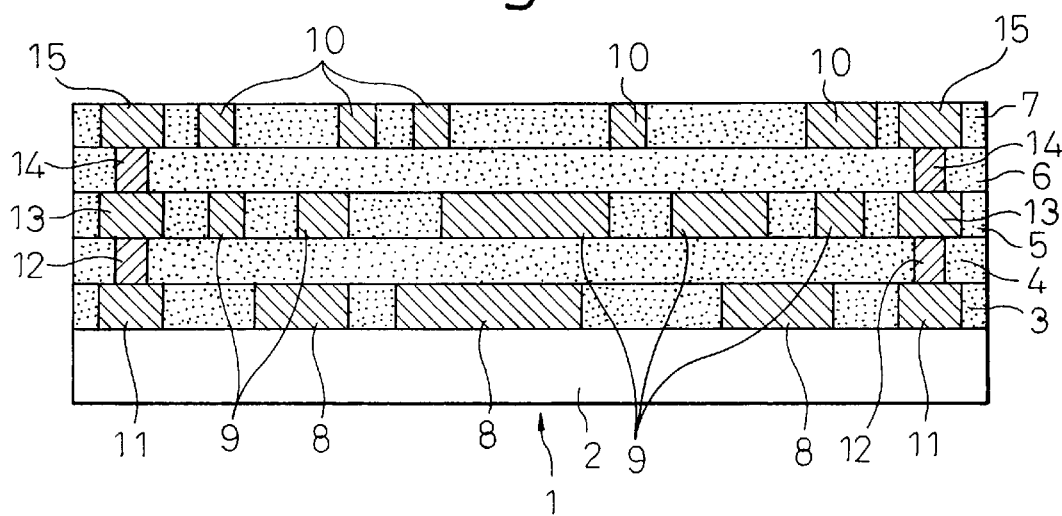
FIG. 1B is a sectional view along A—A line in FIG. 1A.

FIG. 1A is a plan view of a printed-circuit board according to one embodiment of the present invention, and FIG. 1B is a sectional view along A—A line in FIG. 1A.

In FIGS. 1A and 1B, the printed-circuit board 1 is formed as a multi-layer wiring board having a build-up structure. That is, the printed-circuit board 1 is formed as a high density printed-circuit board in which the conductive layer and the insulating layer are alternatively laid on a core layer 2.

The printed-circuit board includes the core layer 2 which is used as a base substrate. In this case, the core layer 2 may be a printed-circuit board which has an optional conductive pattern (e.g., electrode pattern), or may be a simple board. Further, the core layer may be a thin board-like member, or may be a thick board-like member (i.e., cubic member). In this embodiment, the glass-epoxy resin having the coefficient of linear thermal expansion of $1 \times 10^{-5}/°$ C., is used as the core layer 2.

The insulating layers 3 to 7 are laid on the core layer 2, and are made of epoxy resin having a coefficient of linear thermal expansion of $6 \times 10^{-5}/°$ C.

A plurality of conductive patterns (e.g., electrode patterns) 8 are formed in the insulating layer 3.

Further, a plurality of conductive patterns (e.g., electrode patterns) 9 are formed in the insulating layer 5. Still further, a plurality of conductive patterns (e.g., electrode patterns) 10 are formed in the insulating layer 7. Each of the conductive patterns 8 to 10 is made of copper (Cu), and is formed of the material having a coefficient of linear thermal expansion of $1.7 \times 10^{-5}/°$ C.

In this case, a plurality of flip-chips (not shown) are mounted on the surface of the insulating layer 7, and are electrically connected to each conductive pattern (e.g., electrode pattern) 10. In the insulating layer 3, a closed and curved pattern 11 is formed so as to surround the conductive patterns 8. Further, in the insulating layer 4, the closed and curved pattern 12 is formed along the side of the printed-circuit board 1.

Still further, in the insulating layer 5, the closed and curved pattern 13 is formed so as to surround the conductive patterns 9. Still further, in the insulating layer 6, the closed and curved pattern 14 is formed along the side of the printed-circuit board 1. Still further, as shown in FIG. 1A, in the insulating layer 7, the closed and curved pattern 15 is formed so as to surround the conductive patterns 10.

The closed and curved pattern 15 is formed by a square frame configuration, as shown in FIG. 1A, and is formed along each side of the square printed-circuit board 1. The closed and curved patterns 11 to 14 have the same square structure as the closed and curved pattern 15. As shown in FIG. 1B, the closed and curved patterns 11 to 15 are arranged so as to be laid on each other.

The closed and curved patterns 11 to 15 are formed of copper (Cu) which is the same material as the conductive patterns 8 to 10, and has a coefficient of linear thermal expansion of $1.7 \times 10^{-5}/°$ C. As explained above, the closed and curved patterns 11 to 15 are formed so as to surround the conductive patterns 8 to 10 in each insulating layers 3 to 7, and each is formed of a material having a coefficient of linear thermal expansion smaller than that of the insulating layers 3 to 7.

In this case, when the coefficient of linear thermal expansion of the insulating layers 3 to 7 is $\alpha 1$, when the coefficient of linear thermal expansion of the conductive patterns 8 to 10 is $\alpha 2$, and when the coefficient of linear thermal expansion of the closed and curved patterns 11 to 15 is $\alpha 3$, the following conditions are satisfied in this embodiment, i.e., $\alpha 1$ is $6 \times 10^{-5}/°$ C., $\alpha 2 = \alpha 3$ is $1.7 \times 10^{-5}/°$ C., and $\alpha 1 > \alpha 2 \geq \alpha 3$, more exactly, $\alpha 1 > \alpha 2 = \alpha 3$.

An area surrounded by the closed and curved pattern 11 to 15 in the printed-circuit board 1 becomes a stress field to which the thermal stress is applied, and the conductive patterns 8 to 10 are positioned in this stress field.

The manufacturing process of the printed-circuit board 1 will be explained in detail below.

First, when the core layer 2 is prepared, and the insulating layer 3 is formed on the core layer 3. Further, the conductive patterns 8 made of copper are formed in the insulating layer 3. At that time, the closed and curved pattern 11 of copper is formed around the conductive patterns 8. Further, the insulating layer 4 is formed on the insulating layer 3, and the closed and curved pattern 12 made of copper is formed in the insulating layer 4. Still further, the insulating layer 5 is formed on the insulating layer 4, the conductive patterns 9 made of copper are formed in the insulating layer 5, and the closed and curved pattern 13 made of copper is formed around the conductive patterns 9 in the insulating layer 5.

Still further, the insulating layer 6 is formed on the insulating layer 5, and the closed and curved pattern 14 made of copper is formed in the insulating layer 6. Still further, the insulating layer 7 is formed on the insulating layer 6 and the conductive patterns 10 made of copper are formed in the insulating layer 7. At that time, the closed and curved pattern 15 is formed around the conductive patterns 10.

In this case, the insulating layers 3 to 7 are formed by using either a pressing method or a coating method. As a method of forming the conductive patterns 8 to 10 and the closed and curved patterns 11 to 15, it is possible to use either an etching process or an additive process using a plating resist or electroless copper plating. As a concrete example, either the plating method (e.g., an electric copper plating method, an electroless copper plating, etc.) or a paste method (e.g., a metal-paste method) are used for forming the conductive patterns 8 to 10 and the closed and curved patterns 11 to 15. That is, it is necessary to form the conductive patterns, which are used as the electrodes, and the closed and curved patterns.

Next, the operation will be explained in detail below when the heat is added to the printed-circuit board 1.

As explained above, in the printed-circuit board 1, the conductive patterns 8 to 10 are formed in the area (i.e., stress field) surrounded by the closed and curved patterns 11 to 15. When the heat is applied to the printed-circuit board 1, based on the difference between the coefficient of linear thermal expansion of the insulating layers 3 to 7 (i.e., $6 \times 10^{-5}/°$ C.) and that of the conductive patterns 8 to 10 (i.e., $1.7 \times 10^{-5}/°$ C.) in the area (i.e., stress field), the thermal stress occurs in the boundary portion under each of conductive patterns 8 to 10 in each of insulating layers 3 to 7.

In this case, however, since the closed and curved patterns 11, 13 and 15 are provided in the insulating layers 3, 5 and 7, the thermal stress is dispersed based on an effect of the hydrostatic pressure. That is, each area (i.e., stress field)

surrounded by the closed and curved patterns 11 to 15 becomes a compressive field due to the existence of the closed and curved patterns 11 to 15 each of which has a coefficient of linear thermal expansion smaller than that of the insulating layers 3 to 7.

Accordingly, it is possible to disperse the thermal stress which occurs in the printed-circuit board 1, and it is possible to prevent cracks being generated in the boundary portion under each conductive pattern 8 to 10 in each insulating layer 3 to 7. Further, the insulating layers 3 to 7 are weak when a tensile stress is applied thereto, but, are strong when a compressive stress is applied thereto.

As explained above, it is possible to suppress the thermal stress which occurs in the boundary portion under each of conductive patterns 8 to 10 in the insulating layers 3 to 7. Accordingly, when the heat is applied to the printed-circuit board 1, it is possible to prevent cracks being generated in the boundary portion under each conductive pattern 8 to 10 in the insulating layers 3 to 7.

Therefore, it is possible to provide an improved printed-circuit board having a structure which has a stable stress dispersing effect by changing the area, which is surrounded by the closed and curved patterns 11 to 15, to a compressive field based on the effect of the hydrostatic pressure in the closed and curved patterns 11 to 15.

Figure 2:
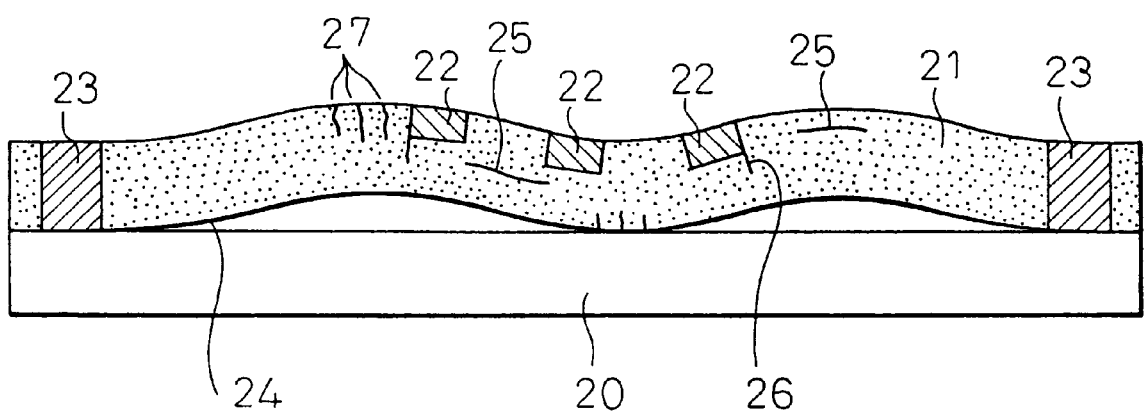
FIG. 2 is an explanatory view for explaining a problem which occurs in the case that a coefficient of linear thermal expansion of a closed and curved pattern is very small compared to that of a core layer, an insulating layer, and a conductive pattern.

FIG. 2 is an explanatory view for explaining a problem which occurs in the case that the coefficient of linear thermal expansion of the closed and curved pattern 23 is very small compared to that of the core layer 20, the insulating layer 21, and the conductive pattern 22.

As shown in FIG. 2, when the coefficient of linear thermal expansion of the closed and curved pattern 23 is very small compared to that of the insulating layer 21, the insulating layer 21 is deformed into a wave shape since the deformation caused by the thermal stress must be absorbed in the area surrounded by the closed and curved pattern 23.

As a result, since the stress distribution becomes uneven in the printed-circuit board, there are the following problems as shown in FIG. 2. That is, the boundary portion between the core layer 20 and the insulating layer 21 is peeled off as shown by the number 24, inner cracks occur in the insulating layer 21 as shown by the number 25, boundary cracks occur under the conductive layer 22 in the insulating layer 21 as shown by the number 26, and surface cracks occur on the surface (particularly, the convex portion of the wave shape) of the insulating layer 21 as shown by the number 27.

As explained in FIG. 2, when the coefficient of linear thermal expansion of the closed and curved pattern 23 is very small compared to that of the insulating layer 21, there are problems which produce inner and surface cracks, peeling-off, etc., in the insulating layer 21.

In the present invention, copper (Cu) is used for the closed and curved patterns 11 to 15 in order to solve the above problems. That is, each of insulating layers 3 to 7 has a coefficient of linear thermal expansion of $6\times10^{-5}/°$ C., and each of closed and curved patterns 11 to 15 has a coefficient of linear thermal expansion of $1.7\times10^{-5}/°$ C.). As a result, it is possible to solve the above problems because both coefficients of linear thermal expansion are very close each other.

Briefly, the present invention has the following features.

a) Since the closed and curved patterns 11 to 15, each having a coefficient of linear thermal expansion smaller than that of the conductive patterns 8 to 10 and each surrounding the corresponding conductive patterns 8 to 10, are provided in each insulating layers 3 to 7, it is possible to prevent cracks occurring in the insulating layer.

That is, when the heat is applied to the printed-circuit board, the thermal stress occurs in the boundary portion under the conductive patterns 8 to 10 in the insulating layers 3 to 7 due to the difference in coefficients of linear thermal expansion. In the present invention, however, the thermal stress is dispersed in the area surrounded by the closed and curved patterns 11 to 15 based on the effect of the hydrostatic pressure caused by the closed and curved patterns 11 to 15, so that the thermal stress becomes weak in the boundary portion under the conductive patterns 8 to 10 in the insulating patterns 3 to 7. As a result, it is possible to prevent cracks occurring in the insulating layer, and to improve the reliability of the printed-circuit board when heat is applied thereto.

b) If the closed and curved patterns 11 to 15 are formed by the same material as that of conductive patterns 8 to 10, this is preferable in the practical use of the printed-circuit board. That is, when the closed and curved patterns 11 to 15 are made of copper, it is possible to form the closed and curved patterns 11 to 15 in the process of forming the conductive pattern since the conductive patterns are made of copper.

c) When the coefficient of linear thermal expansion of the insulating layers 3 to 7 is $\alpha1$, when the coefficient of linear thermal expansion of the conductive patterns 8 to 10 is $\alpha2$, and when the coefficient of linear thermal expansion of the closed and curved patterns 11 to 15 is $\alpha3$, it is preferable, in the practical use of the printed-circuit board, that the following condition, i.e., $\alpha1>\alpha2\geq\alpha3$, is satisfied.

The following structures may be possible within the scope of the present invention.

1) The closed and curved patterns 11 to 15 may be formed by the material having the coefficient of linear thermal expansion smaller than that of the insulating layer 3 to 7. For example, besides the copper (Cu), it is possible to use a resin which has a coefficient of linear thermal expansion smaller than that of the insulating layer 3 to 7. Further, it is possible to use a metal material such as copper, nickel, etc. or a non-metal material.

2) Although the closed and curved patterns are formed in all insulating layers, it is possible to provide the closed and curved patterns for only the upper most layer; or for the upper most layer and the second layer; or for the upper most layer, the second layer and the third layer; or for the upper most layer, the second layer, the third layer and the fourth layer. That is, the layer(s) to be provided with the closed and curved patterns is determined by the quality to be required of the product, i.e., printed-circuit board.

This means that, if the prevention of the cracks caused by the thermal expansion of the resin is very important, the closed and curved patterns must be provided in all insulating layers. On the other hand, if the high durability is not required for the printed-circuit board, the closed and curved pattern is provided only for the upper most layer.

Figure 3:
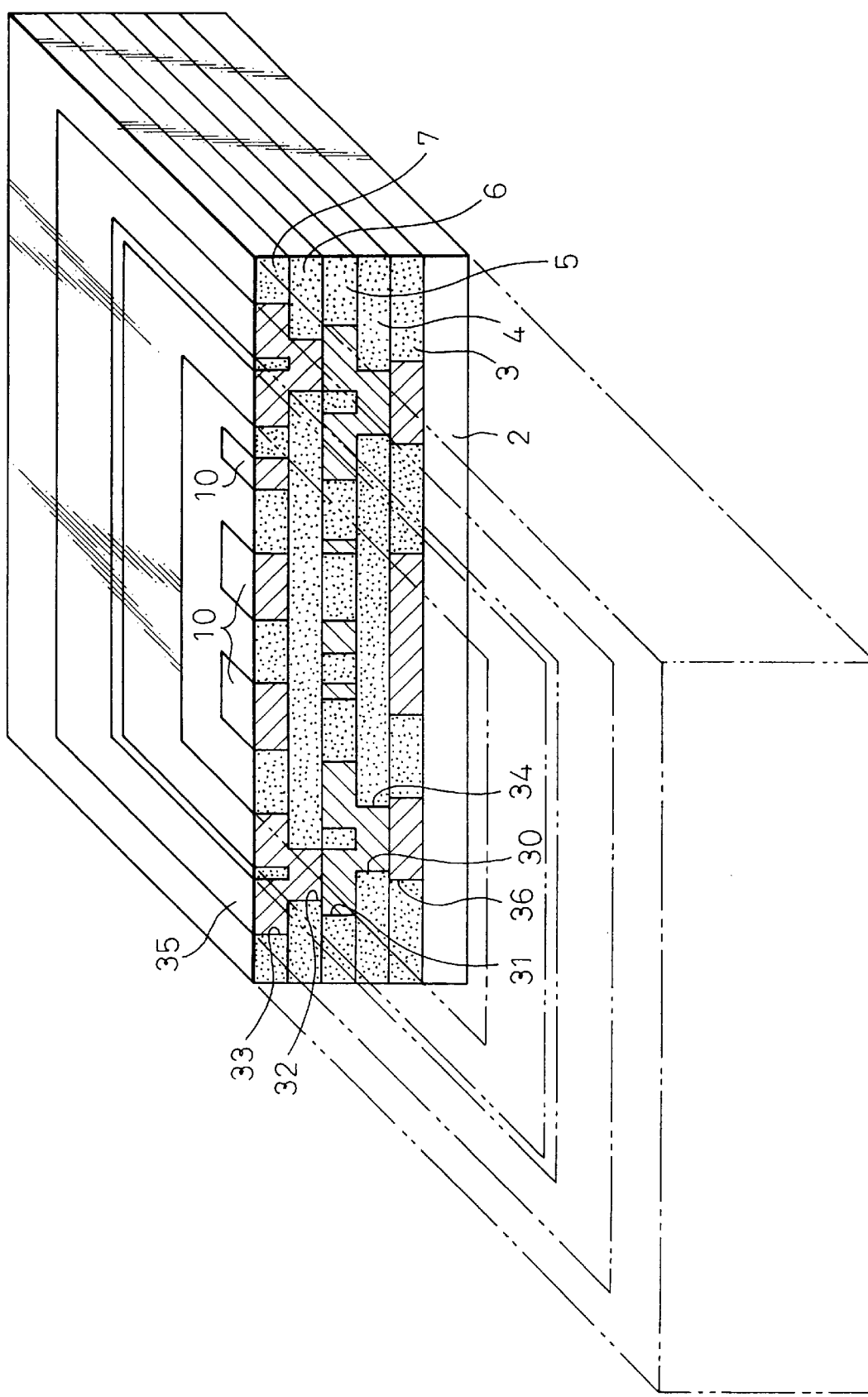
FIG. 3 is a perspective and sectional view of the printed-circuit board according to the second embodiment of the present invention.

3) In FIG. 1, the closed and curved pattern was formed for each insulating layer. Further, FIG. 3 shows another embodiment of the present invention. In FIG. 3, reference numbers 30 to 33 are grooves which are buried or filled with paste or plating in order to form the closed and curved patterns 34 and 35.

That is, as shown in FIG. 3, the closed and curved pattern 36 is formed in the insulating layer 3, and, after the groove 30 was formed in the insulating layer 4 and the groove 31 was formed in the insulating layer 5, the closed and curved pattern 34 is formed by filling the grooves 30 and 31 with paste or plating. Further, after the groove 32 was formed in the insulating layer 6 and the groove 33 was formed in the insulating layer 7, the closed and curved pattern 35 is formed by filling the grooves 32 and 33 with paste or plating.

In the present invention, of course, it is possible to use the closed and curved pattern which has a partially opening portion in the pattern. That is, the substantially closed pattern is used as the closed and curved pattern, and it is not necessary to always use the completely closed pattern.

What is claimed is:

1. A printed-circuit board comprising:

a plurality of insulating layers that are laminated onto one another;

a plurality of conductive patterns formed in each insulating layer; and a substantially closed and curved pattern at least formed in an upper most insulating layer to surround the conductive pattern therein, said pattern being formed by a material having a coefficient of linear thermal expansion smaller than that of the insulating layer.

2. A printed-circuit board as claimed in claim 1, wherein each closed and curved pattern is formed of the same material as that of each conductive pattern.

3. A printed-circuit board as claimed in claim 1, wherein each closed and curved pattern is made of copper.

4. A printed-circuit board as claimed in claim 1, wherein when the coefficient of linear thermal expansion of each insulating layer is $\alpha 1$, when the coefficient of linear thermal expansion of each conductive layer is $\alpha 2$, and when the coefficient of linear thermal expansion of each closed and curved pattern is $\alpha 3$, the following condition, i.e., $\alpha 1 > \alpha 2 \geq \alpha 3$, is satisfied.

* * * * *